(12) United States Patent
Iida et al.

(10) Patent No.: US 8,164,668 B2
(45) Date of Patent: Apr. 24, 2012

(54) PHOTOELECTRIC CONVERSION DEVICE AND IMAGE CAPTURING SYSTEM

(75) Inventors: Satoko Iida, Yokohama (JP); Mahito Shinohara, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 81 days.

(21) Appl. No.: 12/824,306

(22) Filed: Jun. 28, 2010

(65) Prior Publication Data

US 2011/0019052 A1    Jan. 27, 2011

(30) Foreign Application Priority Data

Jul. 27, 2009 (JP) ................... 2009-174729

(51) Int. Cl.
H04N 3/14 (2006.01)
H04N 5/335 (2011.01)
H01L 21/00 (2006.01)

(52) U.S. Cl. .................. 348/308; 348/302; 438/75
(58) Field of Classification Search .......... 348/302–310; 438/75
See application file for complete search history.

(56) References Cited

U.S. PATENT DOCUMENTS

| | | | |
|---|---|---|---|
| 4,962,412 A | 10/1990 | Shinohara et al. | 357/30 |
| 5,008,206 A | 4/1991 | Shinohara et al. | 437/3 |
| 5,060,042 A | 10/1991 | Shinohara et al. | 357/30 |
| 5,086,326 A | 2/1992 | Shinohara et al. | 357/30 |
| 5,146,339 A | 9/1992 | Shinohara et al. | 358/212 |
| 5,280,358 A | 1/1994 | Yushiya et al. | 358/213.17 |
| 6,774,453 B2 | 8/2004 | Okita | 257/506 |
| 6,828,601 B2 | 12/2004 | Shinohara | 257/183.1 |
| 6,876,019 B2 | 4/2005 | Shinohara | 257/292 |
| 7,250,970 B2 | 7/2007 | Shinohara | 348/308 |
| 7,394,492 B2 | 7/2008 | Shinohara | 348/301 |
| 7,741,593 B2 | 6/2010 | Iwata et al. | 250/214 R |
| 7,750,281 B2 * | 7/2010 | Asaba et al. | 250/208.1 |
| 7,787,039 B2 * | 8/2010 | Kimura | 348/310 |
| 7,847,366 B2 * | 12/2010 | Rhodes et al. | 257/506 |
| 8,031,250 B2 * | 10/2011 | Yamashita | 348/308 |
| 2004/0119864 A1 * | 6/2004 | Kikuchi | 348/308 |
| 2005/0253945 A1 | 11/2005 | Shinohara | 348/300 |
| 2006/0007338 A1 * | 1/2006 | Wakano et al. | 348/308 |
| 2007/0058062 A1 * | 3/2007 | Ohta | 348/308 |
| 2008/0252764 A1 | 10/2008 | Shinohara | 348/308 |
| 2009/0231478 A1 | 9/2009 | Shinohara | 348/300 |
| 2009/0316032 A1 * | 12/2009 | Misawa et al. | 348/308 |
| 2010/0002117 A1 | 1/2010 | Iwane et al. | 348/308 |
| 2010/0013975 A1 * | 1/2010 | Nakashima et al. | 348/308 |
| 2010/0039546 A1 * | 2/2010 | Cohen et al. | 348/308 |
| 2010/0060764 A1 * | 3/2010 | McCarten et al. | 348/308 |
| 2010/0194946 A1 | 8/2010 | Shinohara et al. | 348/300 |

FOREIGN PATENT DOCUMENTS

| | | |
|---|---|---|
| JP | 2000-353801 A | 12/2000 |
| JP | 2003-115580 A | 4/2003 |
| JP | 2003-258229 A | 9/2003 |

* cited by examiner

*Primary Examiner* — Lin Ye
*Assistant Examiner* — Chia-Wei A Chen
(74) *Attorney, Agent, or Firm* — Fitzpatrick, Cella, Harper & Scinto

(57) ABSTRACT

A photoelectric conversion device includes an isolation portion defining an active region, a photoelectric converter arranged in the active region and including a charge accumulation region containing an impurity of a first conductivity type, a charge voltage converter arranged in the active region, and a transfer electrode arranged on the active region and configured to form a channel to transfer charges generated by the photoelectric converter to the charge voltage converter. In addition, a first semiconductor region is arranged in the active region between the photoelectric converter and the charge voltage converter and is covered with the transfer electrode and contains the impurity of the first conductivity type at a concentration lower than that in the charge accumulation region. A second semiconductor region extends in the active region along an interface of the isolation portion facing at least the first semiconductor region and is of a second conductivity type.

7 Claims, 11 Drawing Sheets

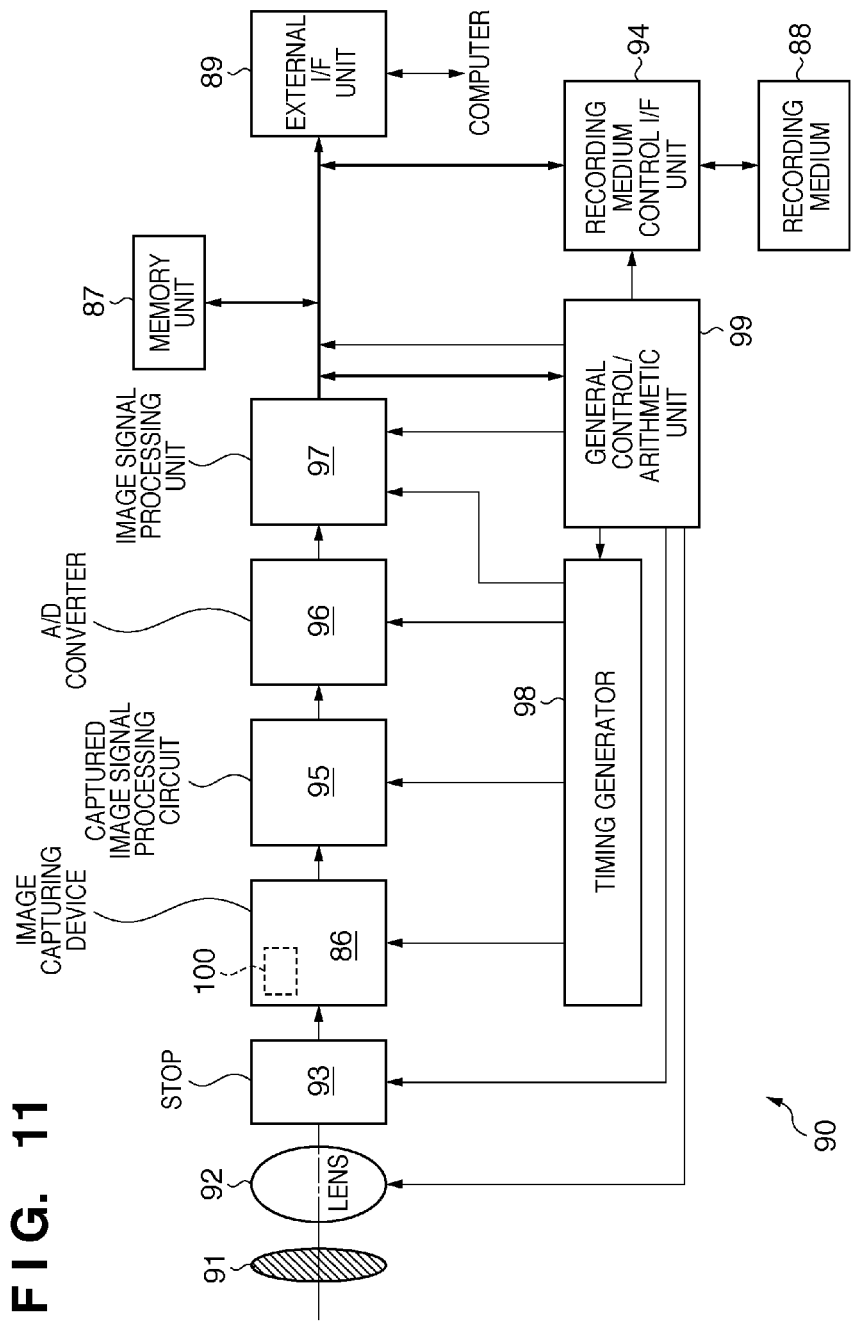

PHOTOELECTRIC CONVERSION DEVICE AND IMAGE CAPTURING SYSTEM

BACKGROUND OF THE INVENTION

1. Field of the Invention

The present invention relates to a photoelectric conversion device and an image capturing system.

2. Description of the Related Art

MOS photoelectric conversion devices are recently in rapid demand because of their merits such as low power consumption and high output speed. Concerning the photoelectric conversion devices, there is a need to improve the transfer efficiency when transferring charges (signal) accumulated in a photodiode (PD) to a floating diffusion (FD).

Japanese Patent Laid-Open No. 2003-115580 describes an image capturing pixel of a solid-state image sensor in which a transfer facilitation region 140 belonging to the same layer as a charge accumulation layer 112 of a PD 110 is provided under a transfer gate 130 for transferring charges from the PD 110 to an FD 120 (FIG. 1 of Japanese Patent Laid-Open No. 2003-115580). A method of forming the transfer facilitation region 140 is shown in FIGS. 4A to 4C of Japanese Patent Laid-Open No. 2003-115580. In the step shown in FIG. 4A of Japanese Patent Laid-Open No. 2003-115580, n-type ions and p-type ions are sequentially implanted into the entire pixel region using a LOCOS layer 210 as a mask. The transfer facilitation region 140 and a dark current suppression layer 170 are thus formed sequentially in the entire pixel region. In the step shown in FIG. 4B of Japanese Patent Laid-Open No. 2003-115580, after forming a gate electrode film 131, n-type ions and p-type ions are sequentially implanted using the gate electrode film 131 and a resist film 230 as a mask. The charge accumulation layer 112 and a photoelectric conversion region 111 of the PD 110 are thus sequentially formed, and simultaneously, the boundaries of the dark current suppression layer 170 and the transfer facilitation region 140 on the side of the PD 110 are formed in a self-aligned manner. In the step shown in FIG. 4C of Japanese Patent Laid-Open No. 2003-115580, n-type ions are implanted using the gate electrode film 131 and a resist film 240 as a mask. The FD 120 is thus formed, and simultaneously, the boundaries of the dark current suppression layer 170 and the transfer facilitation region 140 on the side of the FD 120 are formed in a self-aligned manner. That is, the signal charge transfer facilitation region is formed in a self-aligned matter under the transfer gate. According to Japanese Patent Laid-Open No. 2003-115580, since the transfer facilitation region and the transfer gate can sufficiently overlap, it is supposed to be possible to effectively improve the transfer characteristic of the transfer gate section.

On the other hand, there is a need to reduce noise generated by a dark current in the photoelectric conversion device. Japanese Patent Laid-Open No. 2003-258229 describes providing dark current reduction regions 701 and 702 containing a p-type impurity between an isolation insulating film 104 and a photodiode 201 (n-type semiconductor region 103 and p$^+$-layer 801) (FIGS. 7 and 8 of Japanese Patent Laid-Open No. 2003-258229). Since this structure can reduce the amount of minority carrier (electrons) which is generated immediately under an interconnection layer 105 and diffused to the photodiode 201, it is supposed to be possible to reduce the dark current of the photodiode 201. Japanese Patent Laid-Open No. 2000-353801 describes a solid-state image sensor structure in which a p$^+$-impurity region 1a extends from an end portion E of an isolation insulating layer 3 to the side of the formation region of a transfer switch M1 in a semiconductor substrate 2 under a gate electrode layer 8a of the transfer switch M1 (FIG. 1 of Japanese Patent Laid-Open No. 2000-353801). A method of forming the p$^+$-impurity region 1a is shown in FIGS. 7 to 9 of Japanese Patent Laid-Open No. 2000-353801. In the step shown in FIG. 7 of Japanese Patent Laid-Open No. 2000-353801, a silicon nitride film 12 is patterned using a resist pattern 13 as a mask. In the step shown in FIG. 8 of Japanese Patent Laid-Open No. 2000-353801, boron (B) ions are obliquely implanted without removing the resist pattern 13. This enables to implant boron up to the lower region of the patterned silicon nitride film 12. In the step shown in FIG. 9 of Japanese Patent Laid-Open No. 2000-353801, the resist pattern 13 is removed, and thermal oxidation is performed. The isolation insulating layer 3 and the p$^+$-impurity region 1a are thus formed. According to Japanese Patent Laid-Open No. 2000-353801, since the p$^+$-impurity region 1a prevents a depletion layer 50 extending from the p-n junction from reaching the end portion E of the isolation insulating layer 3 (FIG. 10 of Japanese Patent Laid-Open No. 2000-353801), it is supposed to be possible to suppress dark current generation in the transfer transistor section.

The technique described in Japanese Patent Laid-Open No. 2003-115580 forms the transfer facilitation region 140 using the LOCOS layer 210 as a mask. For this reason, the transfer facilitation region 140 is considered to be in contact with the LOCOS layer 210 in the direction of channel width of the transfer gate 130. When the transfer facilitation region 140 is in contact with the LOCOS layer 210, the depletion layer end reaches the interface between the transfer facilitation region 140 and the LOCOS layer 210 upon transferring charges from the charge accumulation layer 112 of the PD 110 to the FD 120. When the depletion layer end reaches the interface of the LOCOS layer 210, a large dark current is generated due to the level of the interface. For this reason, noise caused by the dark current generated due to the level of the interface of the LOCOS layer (isolation portion) 210 mixes with a signal corresponding to the charges transferred from the PD (photoelectric converter) 110 to the FD section (charge voltage converter) 120.

On the other hand, Japanese Patent Laid-Open No. 2003-258229 makes no mention of what kind of semiconductor region should be provided under the gate of the transfer MOS transistor. Japanese Patent Laid-Open No. 2000-353801 makes no mention of how to improve the efficiency of charge transfer from the PD region to the FD region.

SUMMARY OF THE INVENTION

The present invention provides a technique advantageous for improving the efficiency of charge transfer from a photoelectric converter to a charge voltage converter, and also reducing noise caused by a dark current generated due to the level of the interface of an isolation portion under a transfer electrode.

One aspect of the present invention provides a photoelectric conversion device comprising: an isolation portion defining an active region in a semiconductor substrate; a photoelectric converter arranged in the active region and including a charge accumulation region, the charge accumulation region containing an impurity of a first conductivity type and being capable of accumulating signal charges; a charge voltage converter arranged in the active region; a transfer electrode arranged on the active region and configured to form a channel to transfer charges generated by the photoelectric converter to the charge voltage converter; a first semiconductor region arranged in the active region between the photoelectric converter and the charge voltage converter, the first semiconductor region being covered with the transfer electrode and containing the impurity of the first conductivity type at a concentration lower than that in the charge accumulation region; and a second semiconductor region extending in the active region along an interface of the isolation portion facing at least the first semiconductor region, the second semiconductor region being of a second conductivity type opposite to the first conductivity type, wherein the first semiconductor region includes a first portion, and a second portion which is adjacent to the first portion on a side of the photoelectric converter and wider in a direction of channel width of the transfer electrode than the first portion, and the second semiconductor region includes a third portion extending in a direction of channel length of the transfer electrode between the first portion and the isolation portion, and a fourth portion extending in the direction of channel width of the transfer electrode between the second portion and the isolation portion.

Further features of the present invention will become apparent from the following description of exemplary embodiments with reference to the attached drawings.

BRIEF DESCRIPTION OF THE DRAWINGS

FIG. 11 is a block diagram showing the arrangement of an image capturing system using the photoelectric conversion device according to the embodiment.

DESCRIPTION OF THE EMBODIMENTS

In this specification, arranging a second region "on" a first region includes not only arranging the second region immediately on the first region but also arranging the second region on another region formed on the first region. Similarly, arranging a second region "under" a first region includes not only arranging the second region immediately under the first region but also arranging the second region under another region formed under the first region.

Figure 1:
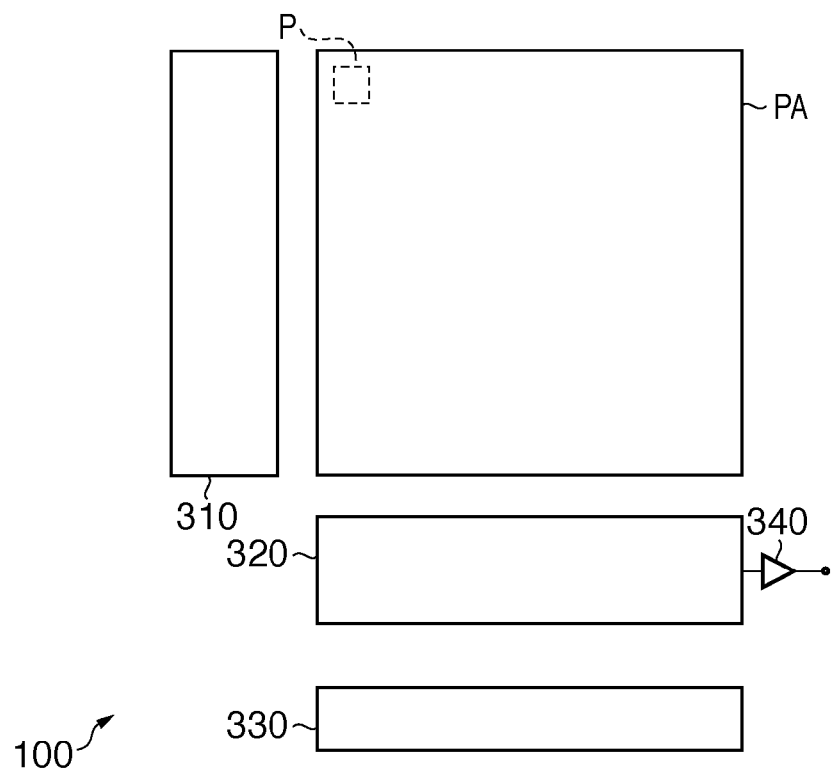
FIG. 1 is a view showing the arrangement of a photoelectric conversion device according to an embodiment.
Figure 2:
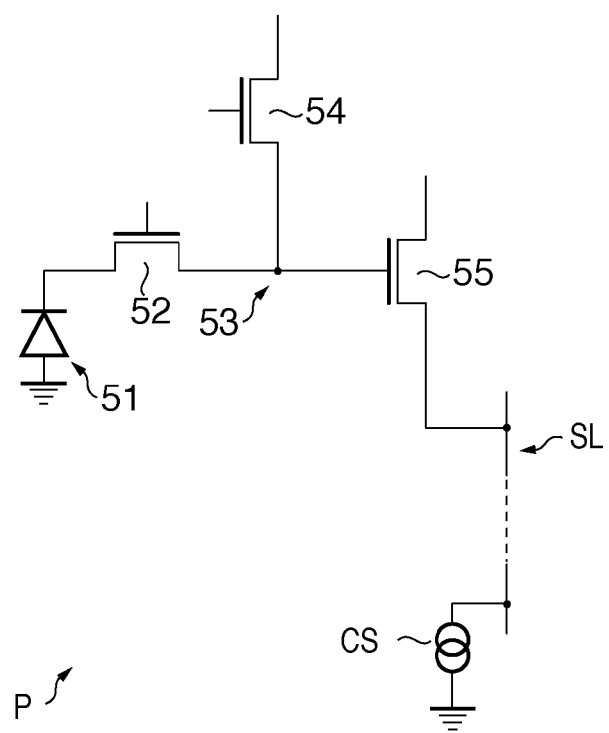
FIG. 2 is a circuit diagram showing the circuit arrangement of a pixel according to the embodiment.

The schematic arrangement of a photoelectric conversion device 100 according to an embodiment of the present invention will be described with reference to FIG. 1. The photoelectric conversion device 100 includes a pixel array PA, vertical scanning circuit 310, holding circuit 320, horizontal scanning circuit 330, and output amplifier 340. In the pixel array PA, a plurality of pixels P are arrayed one- or two-dimensionally. Each pixel P can include a photoelectric converter 51, transfer section 52, charge voltage converter 53, reset section 54, and output section 55, as shown in FIG. 2.

The photoelectric converter 51 generates charges corresponding to light. The photoelectric converter 51 can be, for example, a photodiode. The transfer section 52 transfers the charges generated by the photoelectric converter 51 to the charge voltage converter 53. The transfer section 52 includes, for example, a transfer transistor. When the vertical scanning circuit 310 supplies a transfer control signal of active level to the gate (a transfer electrode 2 to be described later), the transfer transistor is turned on to transfer the charges generated by the photoelectric converter 51 to the charge voltage converter 53. The charge voltage converter 53 converts the transferred charges into a voltage. The charge voltage converter 53 can be, for example, an n-type floating diffusion. The reset section 54 resets the charge voltage converter 53, and sets the pixel P in a selected or unselected state in accordance with a supplied reset potential. The reset section 54 includes, for example, a reset transistor. When the vertical scanning circuit 310 supplies a reset control signal of active level to the gate, the reset transistor is turned on to reset the charge voltage converter 53. In accordance with a supplied first reset potential (for example, H level), the reset section 54 resets the potential of the charge voltage converter 53 to the first reset potential, thereby setting the pixel in the selected state. In accordance with a supplied second reset potential (for example, H level), the reset section 54 resets the potential of the charge voltage converter 53 to the second reset potential, thereby setting the pixel in the unselected state. The output section 55 outputs, to a signal line SL, a signal corresponding to the voltage of the charge voltage converter 53. The output section 55 includes, for example, an amplification transistor. The amplifier transistor performs a source follower operation together with a constant current source CS connected to the signal line SL, thereby outputting the signal corresponding to the voltage of the charge voltage converter 53 to the signal line SL. More specifically, in a state in which the reset section 54 has reset the charge voltage converter 53, the output section 55 outputs a noise signal corresponding to the voltage of the charge voltage converter 53 to the signal line SL. In a state in which the transfer section 52 has transferred charges from the photoelectric converter 51 to the charge voltage converter 53, the output section 55 outputs an optical signal corresponding to the voltage of the charge voltage converter 53 to the signal line SL.

Each pixel P may include a selection section (not shown). In this case, the selection section sets the pixel P in the selected or unselected state. The selection section is, for example, an NMOS selection transistor. When the vertical scanning circuit 310 supplies a selection control signal of active level to the gate, the selection section is turned on to set the pixel P in the selected state. When the vertical scanning circuit 310 supplies a selection control signal of inactive level to the gate, the selection section is turned off to set the pixel P in the unselected state. The vertical scanning circuit 310 scans the pixel array PA in the vertical direction to select a read row to be accessed for signal readout in the pixel array PA so that signals are output from the readout row to the plurality of signal lines SL.

The holding circuit 320 temporarily holds the signals (noise signals and optical signals) of a plurality of columns output from the readout row via the plurality of signal lines SL. The horizontal scanning circuit 330 scans the holding circuit 320 in the horizontal direction so that the signals (noise signals and optical signals) of the plurality of columns held in the holding circuit 320 are sequentially transferred to the output amplifier 340. The output amplifier 340 generates an image signal in accordance with the transferred signals (noise signals and optical signals). For example, the output amplifier generates an image signal by calculating the difference between the noise signals and the optical signals. The output amplifier 340 outputs the generated image signal to the succeeding stage (a captured image signal processing circuit 95 to be described later). If the level of noise caused by a dark current can be suppressed uniformly between the pixels of the pixel array PA, the level of noise signals can also be suppressed uniformly between the pixels. In this case, since the S/N ratio of the image signal generated by the output amplifier 340 can easily be uniformed between the pixels, it is possible to improve the quality of the image obtained by the image signal.

Figure 3:
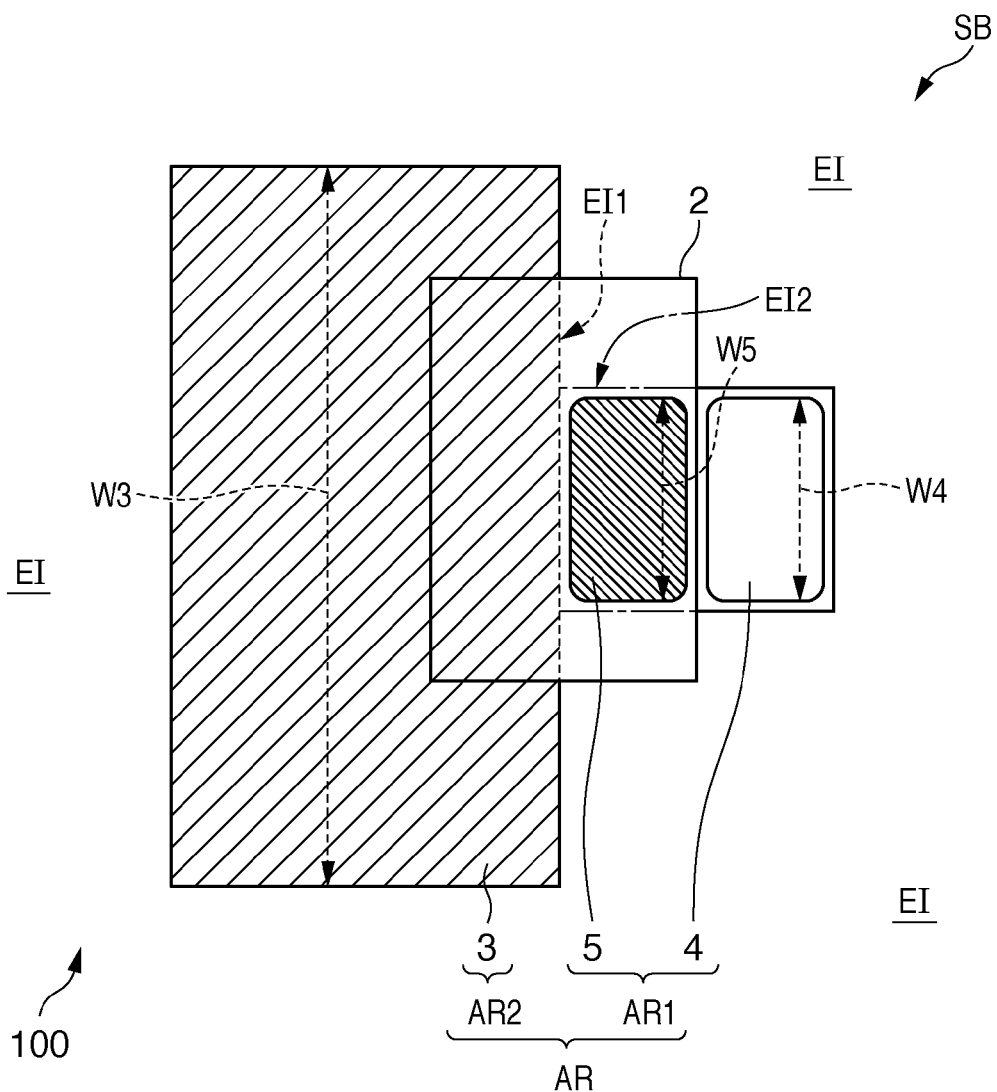
FIG. 3 is a view showing the layout arrangement of a pixel according to the embodiment.
Figure 4:
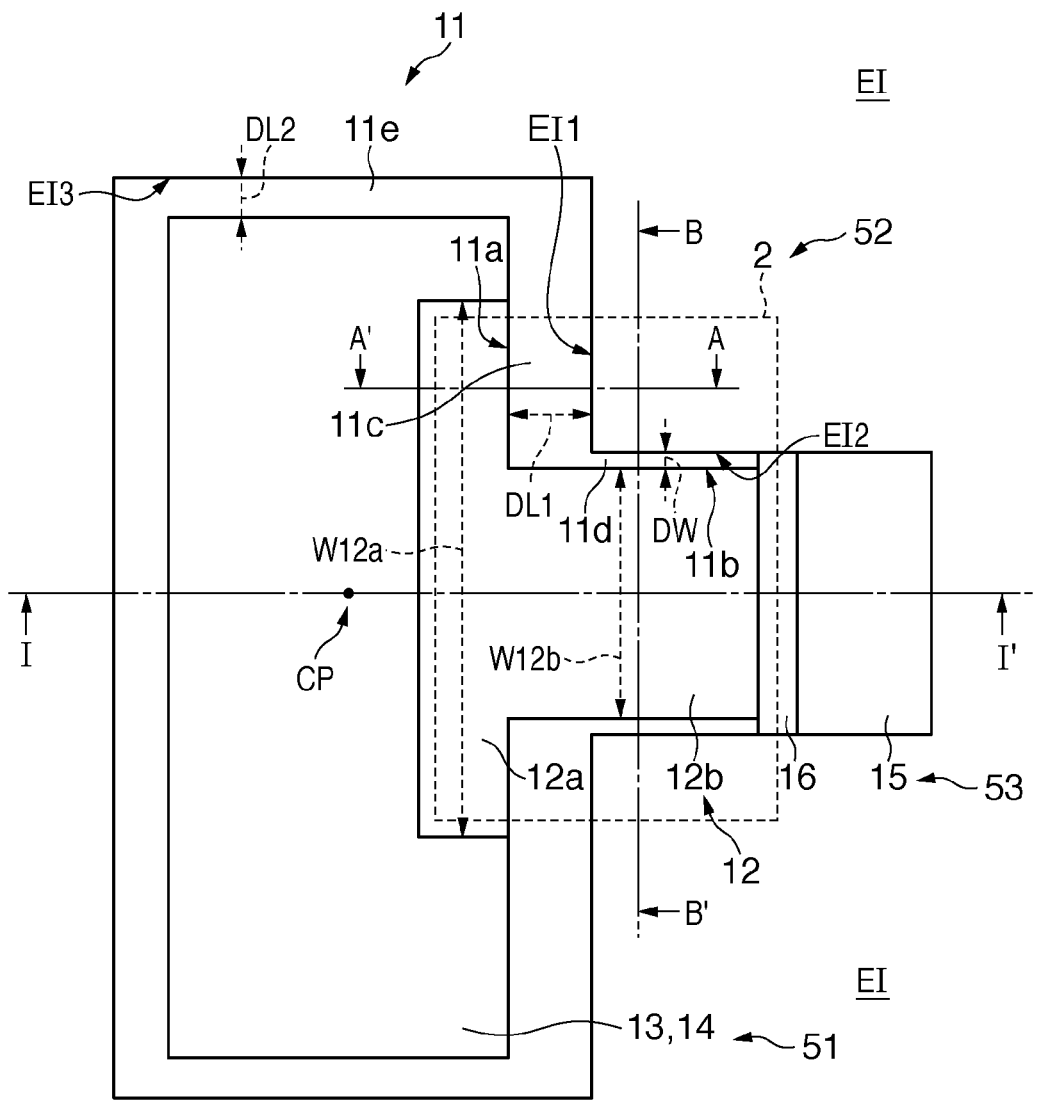
FIG. 4 is a view showing the layout arrangement of a pixel according to the embodiment.
Figure 5A:
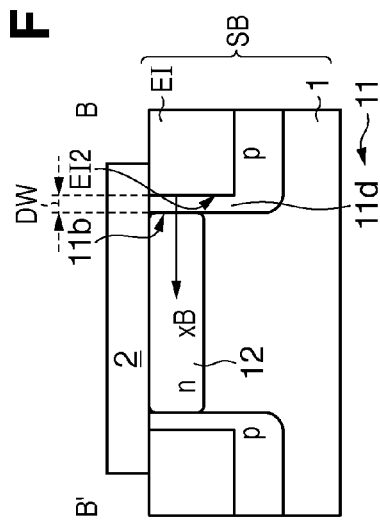
FIGS. 5A to 5D are views showing the sectional structures and impurity profiles of a pixel according to the embodiment.
Figure 5B:
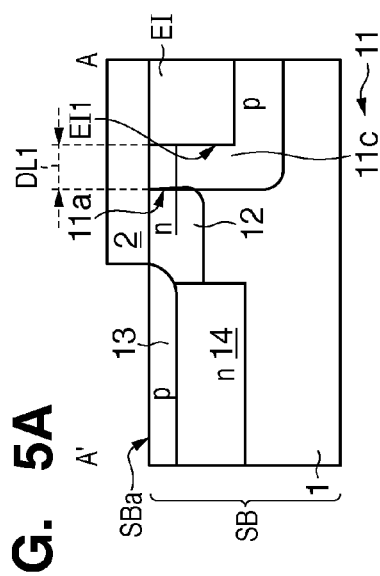

The layout arrangement of the photoelectric conversion device 100 according to the embodiment of the present invention will be described next with reference to FIGS. 3 and 4. An isolation portion EI is arranged in a semiconductor substrate SB to define an active region AR in the semiconductor substrate SB. The semiconductor substrate SB includes a semiconductor region 1 lightly doped with an impurity of a first conductivity type (for example, n-type) (FIGS. 5A and 5B). As the semiconductor region 1, for example, the semiconductor substrate itself, a well region, or a region epitaxially grown on the semiconductor substrate is usable. The following explanation will be made assuming that the semiconductor region 1 is a well. The active region AR in the well region 1 surrounded by the isolation portion EI includes a light-receiving region 3, transfer region 5, and read region 4. The light-receiving region 3 is a region to receive incident light, and is formed into, for example, an almost rectangular shape. The photoelectric converter (FIG. 2) is arranged in the light-receiving region 3 to generate charges corresponding to received light. The photoelectric converter 51 includes a region (charge accumulation region) 14 capable of accumulating signal charges, and a surface region 13 (FIG. 5A). The charge accumulation region 14 is a region to accumulate the charges generated by the photoelectric converter 51, and contains the impurity of the first conductivity type at a concentration higher than that in the well region 1. The surface region 13 is arranged on the charge accumulation region 14 to suppress the dark current in the charge accumulation region 14. The surface region 13 contains an impurity of a second conductivity type (for example, p-type) opposite to the first conductivity type at a concentration higher than that of the impurity of the first conductivity type in the well region 1. The transfer region 5 connects the light-receiving region 3 and the read region 4 to transfer the charges generated by the photoelectric converter 51 to the charge voltage converter 53.

A first semiconductor region 12 is arranged at least in part of the light-receiving region 3 and in the transfer region 5. The first semiconductor region 12 is arranged in the active region AR that is covered with the transfer electrode 2 and located between the photoelectric converter 51 and the charge voltage converter 53. The first semiconductor region 12 contains the impurity of the first conductivity type (for example, n-type) at a concentration higher than in the well region 1 and lower than in the charge accumulation region 14. That is, the concentration of the impurity of the first conductivity type in the first semiconductor region 12 is lower than that in the charge accumulation region 14. This allows to guide, out of the charges generated by the photoelectric converter 51, those leaked into the first semiconductor region 12 to the charge accumulation region 14. It is therefore possible to reduce charge leakage from the first semiconductor region 12 to the charge voltage converter 53 when no voltage is being applied to the transfer electrode 2 (the transfer transistor is off). In addition, a channel (transfer path) should be formed in the first semiconductor region 12 to transfer the charges generated by the photoelectric converter 51 to the charge voltage converter 53 when a transfer control signal of active level is supplied to the transfer electrode 2.

The first semiconductor region 12 includes a first portion 12b and a second portion 12a. The first portion 12b has a width W12b in the direction of channel width of the transfer electrode 2. The second portion 12a is adjacent to the first portion 12b on the side of the photoelectric converter 51 (13 and 14). The second portion 12a has a width W12a in the direction of channel width of the transfer electrode 2, which is larger than the width of the first portion 12b (W12a>W12b). That is, the first semiconductor region 12 has, for example, an almost horizontally oriented T shape when seen through from a direction perpendicular to a surface SBa of the semiconductor substrate SB. For this reason, the contact area between the first semiconductor region 12 and the charge accumulation region 14 is larger than in a case without the second portion 12a. As a result, when the transfer control signal of active level is supplied to the transfer electrode 2, a larger part of the charge accumulation region can be depleted. Since it is easy to completely deplete the charge accumulation region of the photoelectric converter, an effect of helping charge pull-out from the charge accumulation region is obtained. This enables satisfactory signal charge readout. More specifically, since not only the first portion 12b but also the second portion 12a exists under the transfer electrode, the potential barrier of the second portion 12a for the charges can be lowered as well as the potential under the transfer electrode by applying an ON voltage to the transfer electrode. This allows to improve the charge transfer characteristic from the photoelectric converter to the charge voltage converter.

The transfer electrode 2 is arranged on the semiconductor substrate SB to cover part of the light-receiving region 3 and the transfer region 5. The transfer electrode 2 functions as the gate of the transfer section (transfer transistor) 52. That is, upon receiving the transfer control signal of active level, the transfer electrode 2 forms a channel under it (that is, in the first semiconductor region 12).

A second semiconductor region 11 is a portion which extends in the active region AR along interfaces (transfer region surface EI2 and light-receiving region surface EI1) of the isolation portion EI facing at least the first semiconductor region. The second semiconductor region 11 also extends in the active region AR along an interface (second light-receiving region surface EI3) of the isolation portion EI facing the photoelectric converter 51 (13 and 14). The second semiconductor region 11 contains the impurity of the second conductivity type (for example, p-type) at a concentration higher than that of the impurity of the first conductivity type in the well region 1. The second semiconductor region 11 includes a third portion 11d, fourth portion 11c, and fifth portion 11e. The third portion 11d extends in the direction of channel length of the transfer electrode 2 between the isolation portion EI and the first portion 12b under the transfer electrode 2. The third portion 11d has a width DW in the direction of channel width of the transfer electrode 2. The fourth portion 11c extends in the direction of channel width of the transfer electrode 2 between the isolation portion EI and the second portion 12a under the transfer electrode 2. The fourth portion 11c has a width DL1 in the direction of channel length. The fifth portion 11e extends in the active region AR along the interface (second light-receiving region surface EI3) of the isolation portion EI facing the photoelectric converter 51. The fifth portion 11e has a width DL2 in a direction to move away from a center CP of the photoelectric converter 51.

The read region 4 is arranged in part of the active region AR except the light-receiving region 3 and the transfer region 5, from which the output section 55 (FIG. 2) reads out a signal corresponding to the charges transferred from the photoelectric converter 51 to the charge voltage converter 53. The charge voltage converter 53 is arranged in the read region 4 to generate a voltage corresponding to the transferred charges. The transfer region 53 includes a semiconductor region 15. The semiconductor region 15 contains the impurity of the first conductivity type at a concentration higher than that in the well region 1. A third semiconductor region 16 is arranged near the boundary between the transfer region 5 and the read region 4. The third semiconductor region 16 serves as a punch-through stop region for preventing punch-through of charges from the first semiconductor region 12 to the semiconductor region 15, and contains the impurity of the second conductivity type at a concentration higher than that of the impurity of the first conductivity type in the well region 1. The third semiconductor region 16 is a semiconductor region formed by implanting the impurity of the second conductivity type into the semiconductor substrate SB using the transfer electrode 2 as a mask, as will be described later.

Figure 5C:
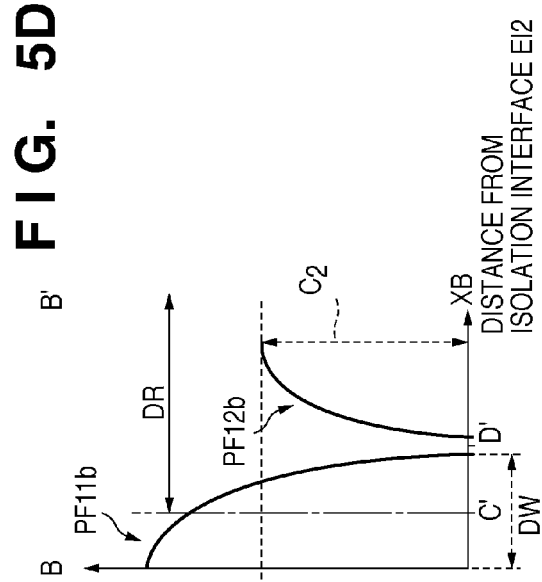
Figure 5D:
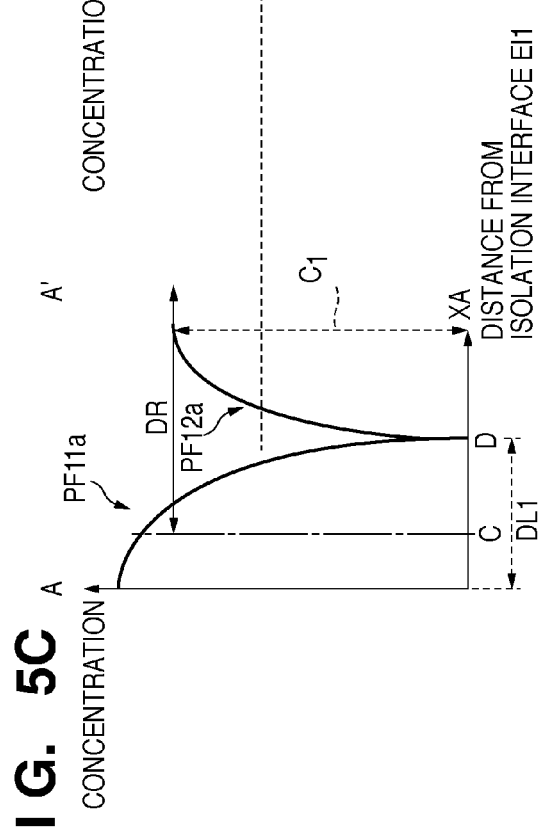

The sectional structure of the photoelectric conversion device 100 according to the embodiment of the present invention will be described next with reference to FIGS. 5A to 5D. FIG. 5A shows the structure of a section taken along a line A'-A in FIG. 4. FIG. 5B shows the structure of a section taken along a line B'-B in FIG. 4. FIG. 5C shows an impurity profile along a line xA in FIG. 5A. FIG. 5D shows an impurity profile along a line xB in FIG. 5B. As shown in FIGS. 4 and 5A, the isolation portion EI has the light-receiving region surface EI1 that extends in the direction of channel width so as to face the fourth portion 11c under the transfer electrode 2. As shown in FIGS. 4 and 5A, the fourth portion 11c has a second side surface 11a that extends in the direction of channel width so as to face the first semiconductor region 12 under the transfer electrode 2. The second side surface 11a is defined by implanting the impurity of the second conductivity type into the semiconductor substrate SB using a resist pattern as a mask, as will be described later. The distance between the light-receiving region surface EI1 and the second side surface 11a equals the width DL1 of the fourth portion 11c (FIG. 4). As shown in FIGS. 4 and 5B, the isolation portion EI has the transfer region surface EI2 that extends in the direction of channel length so as to face the third portion 11d under the transfer electrode 2. As shown in FIGS. 4 and 5B, the third portion 11d has a first side surface 11b that extends in the direction of channel length so as to face the first portion 12b under the transfer electrode 2. The first side surface 11b is defined in a self-aligned manner by implanting the impurity of the second conductivity type into the semiconductor substrate SB using the isolation portion EI as a mask, as will be described later. The distance between the transfer region surface EI2 and the first side surface 11b equals the width DW of the third portion 11d (FIG. 4).

Figure 9:
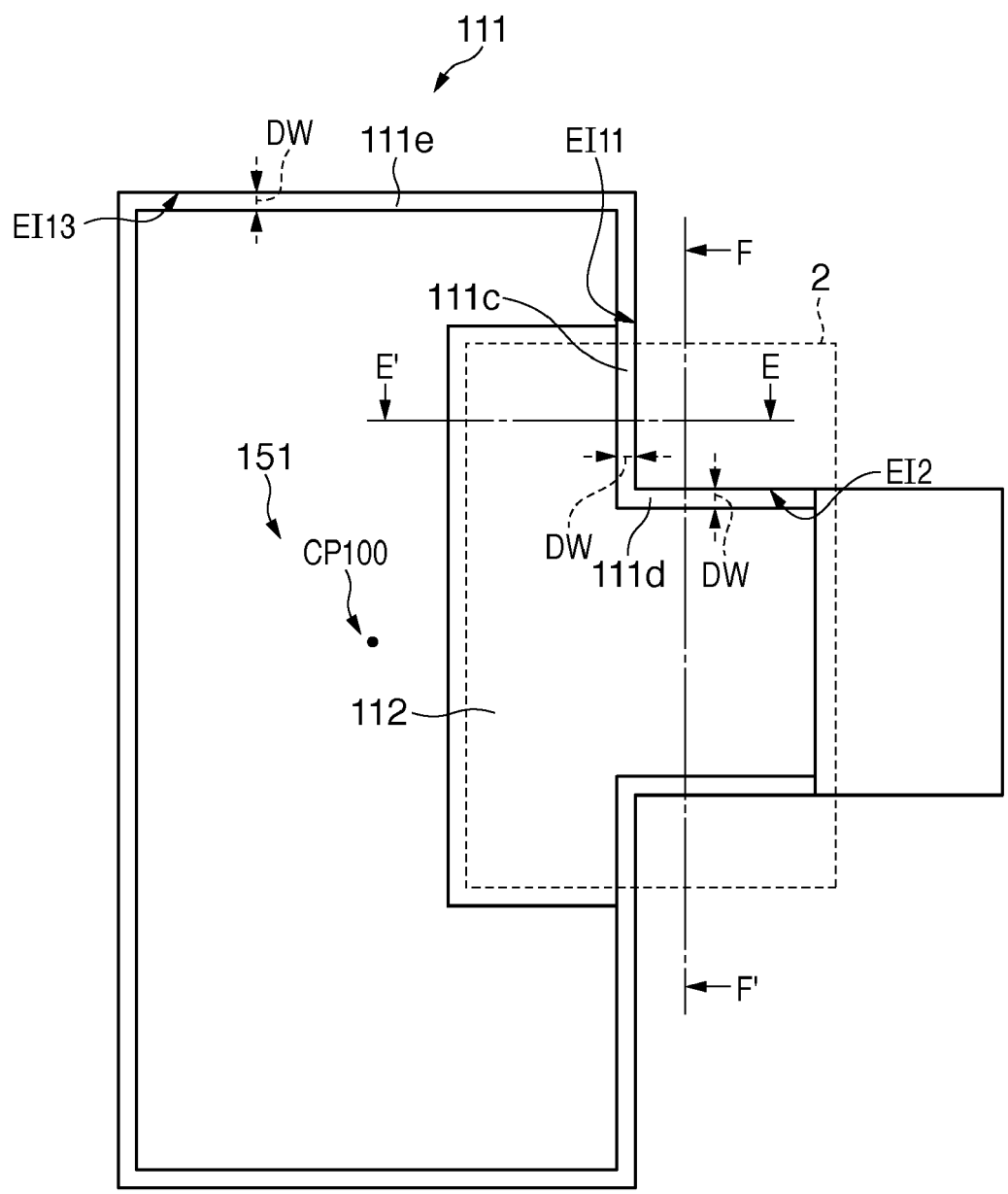
FIG. 9 is a view showing the layout arrangement of a pixel according to a comparative example.

Assume that, as shown in FIG. 9, both the width of a fourth portion 111c in the direction of channel length and the width of a fifth portion 111e in the direction to move away from a center CP100 of a photoelectric converter 151 almost equal the width DW of a third portion 111d. When a second semiconductor region 111 is formed in the uniform width DW over the entire region including the light-receiving region 3 and the transfer region 5, the state of the depletion layer formed upon applying an electric field to the transfer electrode 2 changes between a section along a line E'-E and that along a line F'-F. The electric field to be applied to the transfer electrode 2 corresponds to the transfer control signal of active level. More specifically, the peak concentration of the impurity of the first conductivity type (for example, n-type) in the first semiconductor region mainly arranged in the transfer region is higher than that in the charge accumulation region arranged in the light-receiving region. In this case, the end portion of the depletion layer that spreads from the interface (p-n junction interface) between a first semiconductor region 112 and the second semiconductor region 111 upon applying an electric field to the transfer electrode 2 readily reaches the interface of the isolation portion. When the end portion of the depletion layer (depletion layer end) reaches the interface of the isolation portion, a large dark current is generated due to the level of the interface. That is, depletion near the interface of the isolation portion, which is the primary cause of the dark current, occurs more easily in the light-receiving region than in the transfer region.

Figure 10A:
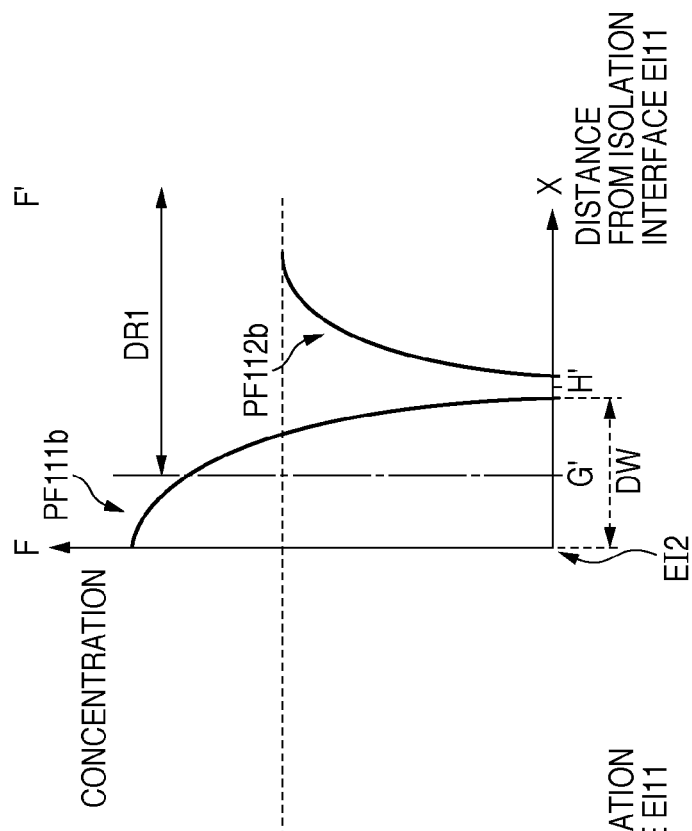
FIGS. 10A and 10B are graphs showing the impurity profiles of a pixel according to the comparative example.
Figure 10B:
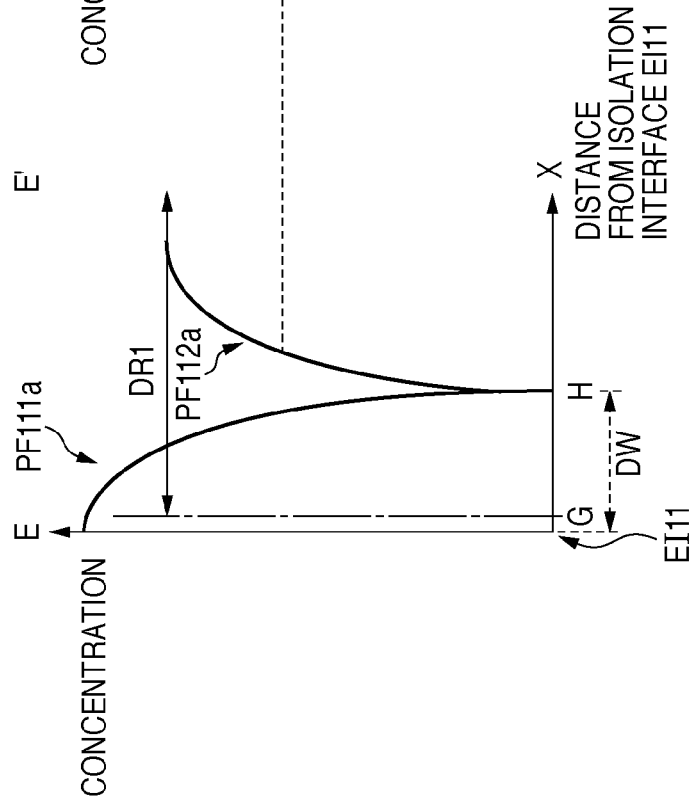

This state will be explained with reference to FIGS. 10A and 10B. FIG. 10A is a graph of the concentration distribution along the section E'-E perpendicular to the light-receiving region surface EI11. FIG. 10A shows a profile PF111a of the impurity of the second conductivity type (for example, p-type) in the second semiconductor region 111 and a profile PF112a of the impurity of the first conductivity type (for example, n-type) in the first semiconductor region 112. FIG. 10B is a graph of the concentration distribution along the section F'-F perpendicular to the transfer electrode surface EI2. FIG. 10B shows a profile PF111b of the impurity of the second conductivity type (for example, p-type) in the second semiconductor region 111 and a profile PF112b of the impurity of the first conductivity type (for example, n-type) in the first semiconductor region 112. FIGS. 10A and 10B also show a depletion layer region DR1 that spreads from the interface (p-n junction interface) between the first semiconductor region 112 and the second semiconductor region 111 upon applying an electric field to the transfer electrode 2 and thus applying a reverse bias to the p-n junction. The position of the end portion (depletion layer end) of the depletion layer region DR1 is indicated by G in FIG. 10A and G' in FIG. 10B. The peak concentration in the profile PF112a of the impurity of the first conductivity type in FIG. 10A is higher than the peak concentration in the profile PF112b of the impurity of the first conductivity type in FIG. 10B, as indicated by the broken line. Hence, the depletion layer end more easily reaches the interface (EI11 and EI2) of the isolation portion in FIG. 10A than in FIG. 10B, as indicated by the alternate long and short dashed lines in FIGS. 10A and 10B. That is, G<G' holds. The position of the junction between the first semiconductor region 112 of the first conductivity type and the second semiconductor region 111 of the second conductivity type is indicated by H in FIG. 10A and H' in FIG. 10B. H≈H' holds. At this time, both the width of the fourth portion 111c and the width of the fifth portion 111e of the second semiconductor region 111 almost equal the width DW of the third portion 111d. When the width DW of the second semiconductor region 111 is determined to improve the efficiency of charge transfer by the transfer electrode 2 from the photoelectric converter 51 to the charge voltage converter 53, the depletion layer end may reach the light-receiving region surface EI11 to generate a dark current. Conversely, when the width DW of the second semiconductor region 111 is determined to sufficiently suppress the dark current on the light-receiving region surface EI11, the width of the charge channel (transfer path) in the transfer region decreases, and the efficiency of charge transfer by the transfer electrode 2 lowers. To form the channel (transfer path) in the transfer region under an optimum concentration distribution condition that enables complete transfer and also uniformly suppress the dark current generated in the light-receiving region and the transfer region, it is necessary to uniform the depletion state (the position of the depletion layer end) on the light-receiving region surface and the transfer region surface. For example, the amount of a dark current generated via the electron trap recombination center on the silicon/silicon oxide film interface depends on the position of the depletion layer end extending near the interface. If the interface is depleted, a large dark current is generated. Even without depletion of the interface, if the depletion layer end is located near the interface, that is, apart from the interface by less than a threshold distance TH, electrons emitted from the electron trap recombination center reach the depletion layer to generate a dark current. Hence, to suppress the dark current amount of the photoelectric conversion device, it is necessary to control the position of the end of the depletion layer formed in the p-n junction. As described above, improving the efficiency of charge transfer from the photoelectric converter to the charge voltage converter and reducing noise caused by the dark current generated due to the level of the interface of the isolation portion under the transfer electrode can hardly go hand in hand.

In this embodiment, both the width DL1 of the fourth portion $11c$ in the direction of channel length and the width DL2 of the fifth portion $11e$ in the direction to move away from the center CP of the photoelectric converter 51 are larger than the width DW of the third portion $11d$. Alternatively, in this embodiment, both the width DL1 of the fourth portion $11c$ in the direction of channel length and the width DL2 of the fifth portion $11e$ in the direction to move away from the center CP of the photoelectric converter 51 are larger than the width DW of the third portion $11d$ by $C_1/C_2$ times or more. $C_1$ is the peak concentration of the impurity of the first conductivity type (for example, n-type) in the charge accumulation region 14. $C_2$ is the peak concentration of the impurity of the first conductivity type in the first semiconductor region 12. This uniforms the state of the depletion layer upon applying the electric field to the transfer electrode 2 on the section A'-A and the section B'-B. More specifically, in both the transfer region and the light-receiving region, the end of the depletion layer that spreads from the interface between the first semiconductor region 12 and the second semiconductor region 11 upon applying the electric field to the transfer electrode 2 is apart from the interface of the isolation portion by the threshold distance TH or more. When the depletion layer end is apart from the interface of the isolation portion by the threshold distance TH or more, the dark current generated by the level of the interface can be suppressed. That is, depletion near the interface of the isolation portion, which is the primary cause of the dark current, hardly occurs in both the transfer region and the light-receiving region.

This state will be explained with reference to FIGS. 5C and 5D. FIG. 5C is a graph of the concentration distribution along the section A'-A perpendicular to the light-receiving region surface EI1. FIG. 5C shows a profile PF11a of the impurity of the second conductivity type (for example, p-type) in the second semiconductor region 11 and a profile PF12a of the impurity of the first conductivity type (for example, n-type) in the first semiconductor region 12. FIG. 5D is a graph of the concentration distribution along the section B'-B perpendicular to the transfer electrode surface EI2. FIG. 5D shows a profile PF11b of the impurity of the second conductivity type (for example, p-type) in the second semiconductor region 11 and a profile PF12b of the impurity of the first conductivity type (for example, n-type) in the first semiconductor region 12. FIGS. 5C and 5D also show a depletion layer region DR that spreads from the p-n junction interface between the first semiconductor region 12 and the second semiconductor region 11 upon applying an electric field to the transfer electrode 2 and thus applying a reverse bias to the junction interface. The position of the end portion (depletion layer end) of the depletion layer region DR is indicated by C in FIG. 5C and C' in FIG. 5D. The peak concentration $C_1$ in the profile PF12a of the impurity of the first conductivity type in FIG. 5C is higher than the peak concentration $C_2$ in the profile PF12b of the impurity of the first conductivity type in FIG. 5D, as indicated by the broken line. Even in this case, $$DL1 = C_1/C_2 \times DW \qquad (3)$$

$$DL2 = C_1/C_2 \times DW \qquad (4)$$

hold. Accordingly, the position of the junction between the first semiconductor region 112 of the first conductivity type and the second semiconductor region 111 of the second conductivity type is indicated by D in FIG. 5C and D' in FIG. 5D. When the position is indicated by D' in FIG. 5D, $$D \approx C_1/C_2 \times D' \qquad (6)$$

holds. The depletion layer end is apart from the interfaces (EI1 and EI2) of the isolation portion by the threshold distance TH or more in FIGS. 5D and 5C, as indicated by the alternate long and short dashed lines in FIGS. 5C and 5D. That is, $$C = C' > TH \qquad (7)$$

holds. This allows to determine the width DW to improve the efficiency of charge transfer by the transfer electrode 2 from the photoelectric converter 51 to the charge voltage converter 53 and also determine the widths DL1 and DL2 to sufficiently suppress the dark current on the light-receiving region surface EI11. That is, according to this embodiment, it is possible to improve the efficiency of charge transfer from the photoelectric converter to the charge voltage converter and also reduce noise caused by the dark current generated due to the level of the interface of the isolation portion under the transfer electrode. Hence, electrons emitted from the electron trap recombination center reach the depletion layer to generate a dark current. Alternatively, when both the width DL1 and the width DL2 are larger than the width DW by less than $C_1/C_2$ times, the depletion layer end upon applying an electric field to the transfer electrode 2 is apart from the interface of the isolation portion by less than the threshold distance TH. Hence, electrons emitted from the electron trap recombination center reach the depletion layer to generate a dark current.

A method of manufacturing the photoelectric conversion device 100 according to the embodiment of the present invention will be described next with reference to FIGS. 6A to 6F. FIGS. 6A to 6F are sectional views corresponding to a section taken along a line I-I' in FIG. 4, which illustrate steps in the method of manufacturing the photoelectric conversion device 100. In the step shown in FIG. 6A, an isolation portion 9 that defines the active region AR (FIG. 3) is formed in the semiconductor substrate SB using a resist pattern RP1 as a mask (first step). The active region AR includes a first region AR1 and a second region AR2. The second region AR2 is adjacent to the first region AR1 in a first direction (the prospective direction of channel length of the transfer electrode 2), and wider than the first region AR1 in a second direction (the prospective direction of channel width of the transfer electrode 2) (W3>W5, and W3>W4). The first region AR1 includes the transfer region 5 and the read region 4. The second region AR2 includes the light-receiving region 3. After that, an impurity of the second conductivity type (for example, p-type) is implanted into the semiconductor substrate SB at a high concentration using, as a mask, the resist pattern RP1 that covers the active region AR and exposes the isolation portion EI (second step). An implantation angle θ at this time is tilted from the direction perpendicular to the surface SBa of the semiconductor substrate SB. The concentration of the impurity of the second conductivity type (for example, p-type) is, for example, $1\times10^{15}$ to $1\times10^{18}$ [/cm$^3$]. The second semiconductor region 11 for dark current suppression, which should be arranged near the isolation portion 9, is thus formed.

Figure 6A:
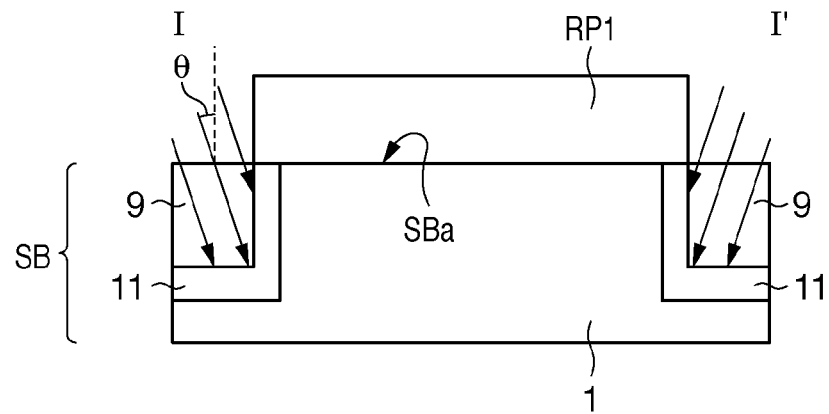
FIGS. 6A to 6F are sectional views showing a method of manufacturing the photoelectric conversion device according to the embodiment.
Figure 6B:
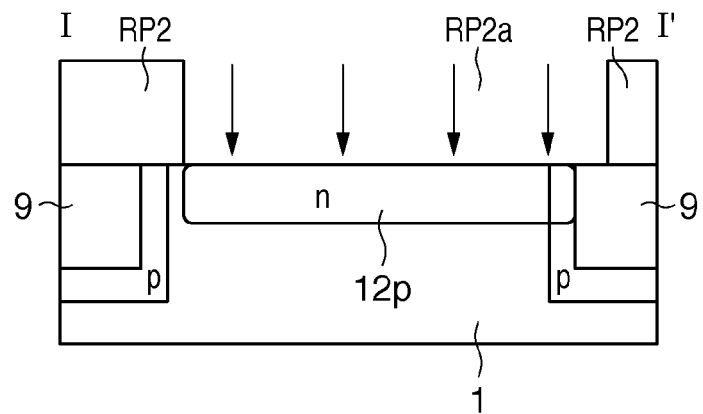
Figure 7:
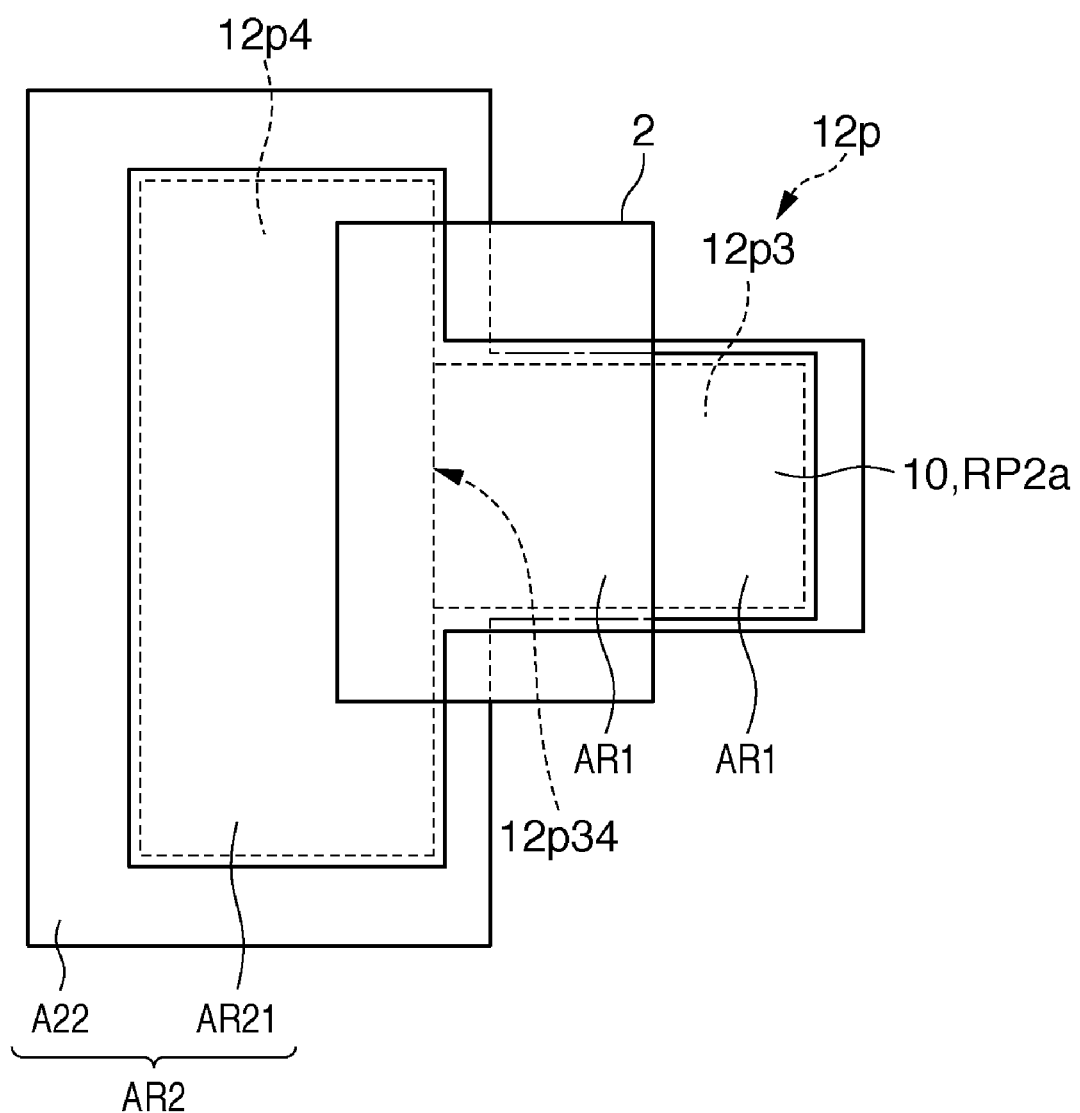
FIG. 7 is a view showing an entire region implantation pattern.

Next, in the step shown in FIG. 6B, a second resist pattern RP2 having an opening RP2a is formed using a retile having an entire region implantation pattern 10 (FIG. 7) (third step). The second resist pattern RP2 exposes the entire surface of the first region AR1 and an inner portion AR21 of the second region AR2, which is wider in the second direction than the first region AR1, and exposes an outer portion AR22 of the second region AR2 (FIG. 7). An impurity of the first conductivity type (for example, n-type) is implanted into the semiconductor substrate SB at a low concentration using the second resist pattern RP2 as a mask. The concentration of the impurity of the first conductivity type (for example, n-type) is lower than that of the impurity of the second conductivity type in the step shown in FIG. 6A. The concentration of the impurity of the first conductivity type is, for example, $1\times10^{15}$ to $1\times10^{17}$ [/cm$^3$]. A semiconductor layer 12p as a prospective first semiconductor region 12 is thus formed. The semiconductor layer 12p includes a third region 12p3 arranged in the first region AR1 (in the first region) and a fourth region 12p4 arranged in the second region AR2 (in the second region) (FIG. 7). The fourth region 12p4 is wider in the second direction (the prospective direction of channel width of the transfer electrode 2) than the third region 12p3. After that, the transfer electrode 2 is formed on the semiconductor layer 12p so as to cover a boundary 12p34 between the third region 12p3 and the fourth region 12p4 (fourth step).

FIG. 7 shows the entire region implantation pattern 10 on the reticle that determines the implantation range of the impurity of the first conductivity type (for example, n-type) in correspondence with the first region AR1 and the second region AR2. Actually, the size of the entire region implantation pattern 10 on the reticle becomes larger in accordance with the magnification of reduction projection exposure. The "entire region" indicates that the impurity is implanted into the entire surface of the first region AR1. In the transfer region 5, the impurity of the first conductivity type (for example, n-type) is implanted into the transfer region surface EI2 of the isolation portion EI in a self-aligned manner. In the light-receiving region 3, the impurity of the first conductivity type is implanted into the region defined by the mask of the second resist pattern RP2. For these reasons, the region determined by the mask and the region determined by the shape of the transfer region surface EI2 of the isolation portion EI exist under the transfer electrode 2. An end portion of the second resist pattern RP2 completely covers the read region 4. However, the present invention is not limited to this. The main object is to uniformly implant the impurity ions of the first conductivity type into the transfer region 5. Hence, the application range of the resist pattern to regions except the region covered by the transfer electrode 2 is appropriately determined.

Figure 6C:
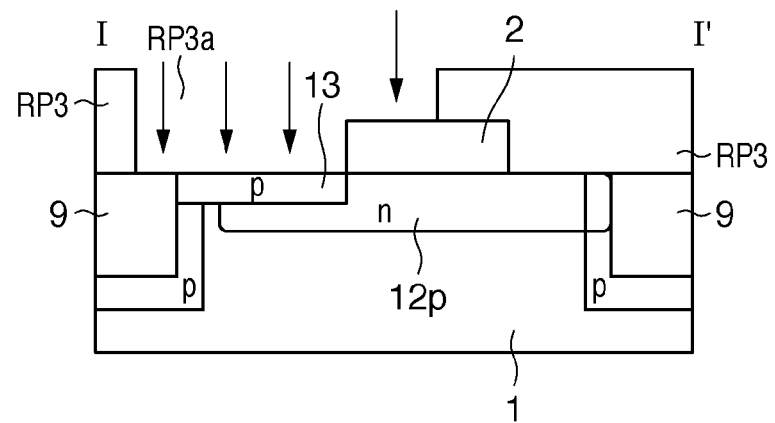
Figure 6D:
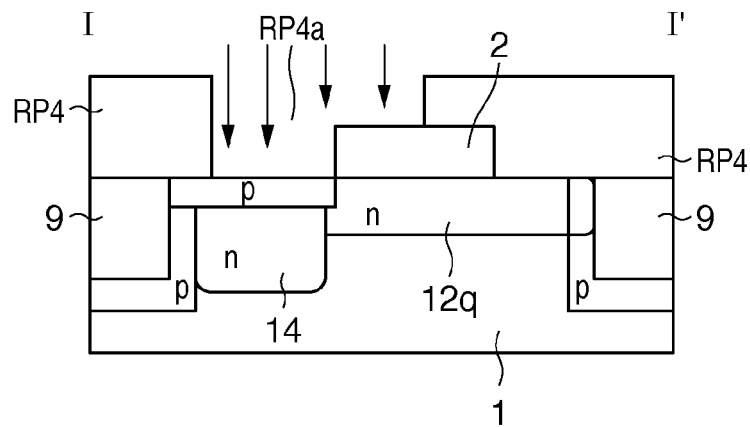
Figure 6E:
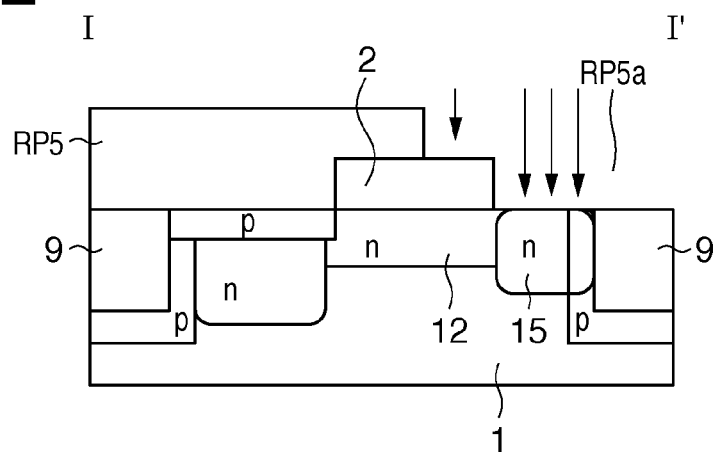

In the step shown in FIG. 6C, the impurity of the second conductivity type (for example, p-type) is implanted into the semiconductor substrate SB at a high concentration using, as a mask, the transfer electrode 2 and a resist pattern RP3 that covers the first region AR1 and exposes the second region AR2. The resist pattern RP3 has an opening RP3a in the light-receiving region 3. The concentration of the impurity of the second conductivity type (for example, p-type) is, for example, $1\times10^{15}$ to $1\times10^{18}$ [/cm$^3$]. The surface region 13 to suppress a dark current caused by the dangling bond on the surface of the semiconductor substrate is thus formed. Next, in the step shown in FIG. 6D, the impurity of the first conductivity type (for example, n-type) is implanted into the semiconductor substrate SB at a high concentration using, as a mask, the transfer electrode 2 and a third resist pattern RP4 which covers the first region AR1 and exposes the second region AR2 (fifth step). The third resist pattern RP4 has an opening RP4a in the light-receiving region 3. The concentration of the impurity of the first conductivity type (for example, n-type) is higher than that in the step shown in FIG. 6B. The concentration of the impurity of the first conductivity type (for example, n-type) is, for example, $1\times10^{15}$ to $1\times10^{18}$ [/cm$^3$]. The charge accumulation region 14 to accumulate signal charges is thus formed. Next, in the step shown in FIG. 6E, the impurity of the first conductivity type (for example, n-type) is implanted into the semiconductor substrate SB at a high concentration using, as a mask, the transfer electrode 2 and a fourth resist pattern RP5 which exposes the first region AR1 and covers the second region AR2 (sixth step). The fourth resist pattern RP5 has an opening RP5a in the read region 4. The concentration of the impurity of the first conductivity type (for example, n-type) is higher than that in the step shown in FIG. 6B. The concentration of the impurity of the first conductivity type (for example, n-type) is, for example, $1\times10^{15}$ to $1\times10^{18}$ [/cm$^3$]. The charge voltage converter 53 is thus formed.

Figure 6F:
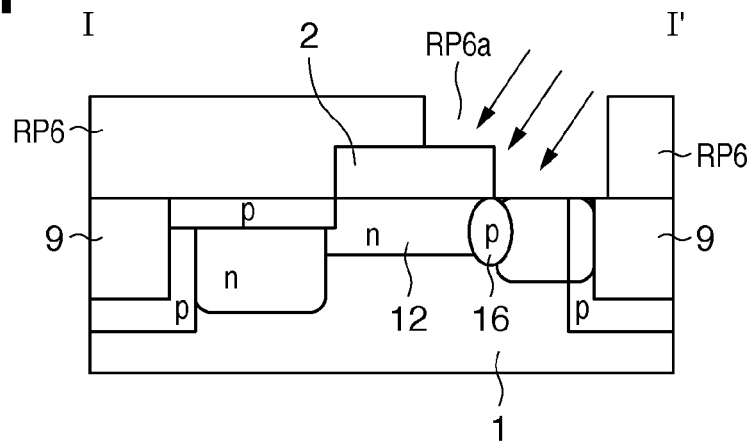

In the step shown in FIG. 6F, the impurity of the second conductivity type (for example, p-type) is implanted into the semiconductor substrate SB at a high concentration using, as a mask, the transfer electrode 2 and a resist pattern RP6 having an opening RP6a in the read region 4. The concentration of the impurity of the second conductivity type (for example, p-type) is higher than that of the impurity of the first conductivity type in the step shown in FIG. 6B. The concentration of the impurity of the second conductivity type (for example, p-type) is, for example, $1\times10^{15}$ to $1\times10^{18}$ [/cm$^3$]. The third semiconductor region 16 to prevent charge punchthrough from the light-receiving region 3 to the read region 4 is thus formed in a self-aligned manner with respect to the transfer electrode 2. A region of the semiconductor layer 12p, in which no impurity is implanted in the steps of FIGS. 6C to 6F, becomes the first semiconductor region 12. Note that the manufacturing method shown in FIGS. 6A to 6F is merely an example, and the present invention is not limited to this. Steps are added as need in accordance with a requested structure to, for example, implant an impurity to form a pixel isolation potential barrier.

Note that referring to FIG. 5C, an ideal impurity of the second conductivity type (for example, p-type) has a peak value of about $1\times10^{15}$ to $1\times10^{18}$ [/cm$^3$]. An ideal impurity of the first conductivity type (for example, n-type) has a peak value of about $1\times10^{15}$ to $1\times10^{17}$ [/cm$^3$]. However, an end portion of the opening RP2a of the second resist pattern RP2 formed by the entire region implantation pattern 10 has an offset from the light-receiving region surface EI1 of the isolation portion EI (FIGS. 5A to 5D, 6A to 6F, and 7). When the position of the p-n junction is the position D in FIG. 5C or the position D' in FIG. 5D, the relation of equation (5) or (6) holds. The position of the p-n junction is farther from the interface of the isolation portion in FIG. 5C than in FIG. 5D. At this time, a reverse bias is applied to the p-n junction such that a depletion layer spreads across the first semiconductor region 12 of the first conductivity type (for example, n-type).

The range indicated by the arrow represents the depletion layer region DR. The position of the depletion layer end that extends to the side of the second semiconductor region 11 of the second conductivity type (for example, p-type) is indicated by C in FIG. 5C and C' in FIG. 5D. In this way, the position of the depletion layer end formed on the light-receiving region surface EI1 and the position of the depletion layer end formed on the transfer region surface EI2 are uniformed. That is, C=C' holds. This allows to simultaneously improve the transfer efficiency and suppress the dark current and white spot defects.

As described above, according to this embodiment, it is possible to obtain a structure that hardly causes depletion on the interface of the isolation portion (silicon oxide film) in both the light-receiving region and the transfer region. Hence, in a photoelectric conversion device having a particularly fine pixel size, it is possible to simultaneously improve the charge transfer efficiency and suppress the dark current and white spot defects.

Figure 8A:
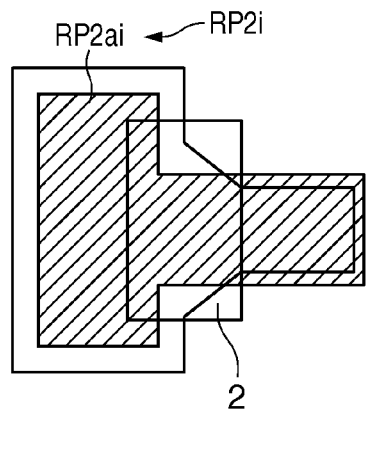
FIGS. 8A to 8D are views showing the layout arrangements of a pixel according to the modifications of the embodiment.
Figure 8B:
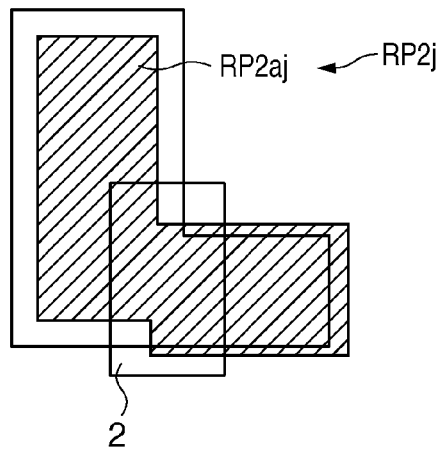
Figure 8C:
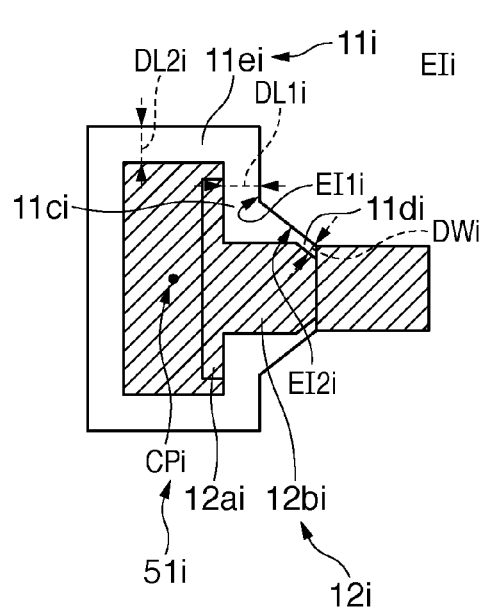
Figure 8D:
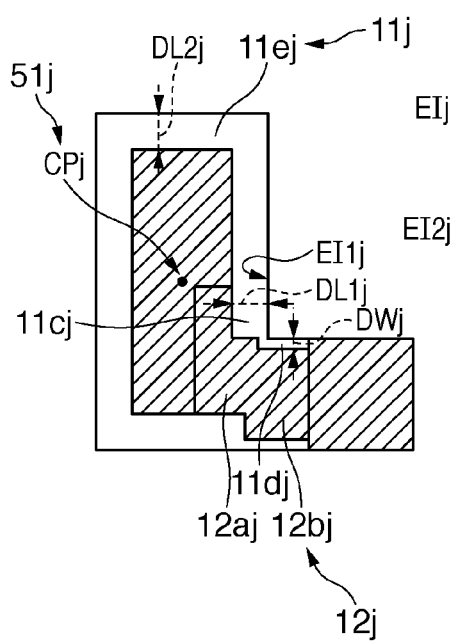

The impurity concentration in each of the light-receiving region and the transfer region and the position of the opening end portion of a resist pattern corresponding to the entire region implantation pattern 10 are appropriately determined in accordance with the light-receiving region shape of the photoelectric conversion device or the required saturation charge amount. For example, the second resist pattern corresponding to the entire region implantation pattern 10 is formed, for example, as shown in FIG. 8A in accordance with another form of the transfer region. FIG. 8A shows a transfer region having a trapezoidal shape. An opening RP2ai of a resist pattern RP2i corresponding to the entire region implantation pattern accordingly has a shape shown in FIG. 8A. At this time, the distance from the position of the junction between a first semiconductor region 12i and a second semiconductor region 11i to the interface of the isolation portion under the transfer electrode 2 changes between the section in the horizontal direction with respect to the charge transfer direction and the section in the vertical direction. More specifically, both a width DL1i of a fourth portion 11ci of the second semiconductor region 11 and a width DL2i of a fifth portion 11ei are larger than a width DWi of a third portion 11di. The fourth portion 11ci extends in the direction of channel width of the transfer electrode 2 between a second portion 12ai and the isolation portion EI. The width DL1i is the width of the fourth portion 11ci in the direction of channel length. The third portion 11di extends in the direction of channel length of the transfer electrode 2 between a first portion 12bi and the isolation portion EI. The width DWi is the width of the third portion 11di in the direction of channel width. The width DL2i is the width of the fifth portion 11ei in the direction to move away from a center CPi of a photoelectric converter 51i. In this way, the position of the depletion layer end formed upon applying an electric field to the transfer electrode 2 can be uniformed between a light-receiving region surface EI1i and a transfer region surface EI2i of an isolation portion EIi. Alternatively, for example, the second resist pattern corresponding to the entire region implantation pattern 10 is formed, for example, as shown in FIG. 8B in accordance with still another form of the transfer region. FIG. 8B shows a transfer region located near a corner of the light-receiving region. An opening RP2aj of a second resist pattern RP2j corresponding to the entire region implantation pattern accordingly has a shape shown in FIG. 8B. At this time, the distance from the position of the junction between a first semiconductor region 12j and a second semiconductor region 11j to the interface of the isolation portion under the transfer electrode 2 changes between the section in the horizontal direction with respect to the charge transfer direction and the section in the vertical direction. More specifically, both a width DL1j of a fourth portion 11cj of the second semiconductor region 11j and a width DL2j of a fifth portion 11ej are larger than a width DWj of a third portion 11dj. The fourth portion 11cj extends in the direction of channel width of the transfer electrode 2 between a second portion 12aj and the isolation portion EI. The width DL1j is the width of the fourth portion 11cj in the direction of channel length. The third portion 11dj extends in the direction of channel length of the transfer electrode 2 between a first portion 12bj and the isolation portion EI. The width DWj is the width of the third portion 11dj in the direction of channel width. The width DL2j is the width of the fifth portion 11ej in the direction to move away from a center CPj of a photoelectric converter 51j. In this way, the position of the depletion layer end formed upon applying an electric field to the transfer electrode 2 can be uniformed between a light-receiving region surface EI1j and a transfer region surface EI2j of an isolation portion EIj. In these modifications, for example, a reverse bias of 3.3 V is applied to the interface of the p-n junction (the junction between the first semiconductor region 12i and the second semiconductor region 11i). A voltage that completely depletes the light-receiving region 3 is about 2.6 V. According to these modifications, it is possible to easily locate the depletion layer end at a uniform position near the interface of the isolation portion in both directions of the isolation portion. This enables control to suppress the number of electrons flowing into the light-receiving region 3. As the depletion layer end approaches the interface, the dark current increases. The position of the depletion layer end can be designed in accordance with the threshold for dark current suppression.

FIG. 11 illustrates an example of an image capturing system using the photoelectric conversion device of the present invention. As shown in FIG. 11, an image capturing system 90 mainly includes an optical system, image capturing device 86, and signal processing unit. The optical system mainly includes a shutter 91, lens 92, and stop 93. The image capturing device 86 includes the photoelectric conversion device 100. The signal processing unit mainly includes a captured image signal processing circuit 95, A/D converter 96, image signal processing unit 97, memory unit 87, external I/F unit 89, timing generator 98, general control/arithmetic unit99, recording medium 88, and recording medium control I/F unit 94. Note that the signal processing unit need not always include the recording medium 88. The shutter 91 is provided on the optical path in front of the lens 92 to control exposure. The lens 92 refracts incident light and forms an object image on the imaging plane of the photoelectric conversion device 100 in the image capturing device 86. The stop 93 is provided on the optical path between the lens 92 and the photoelectric conversion device 100 to adjust the amount of light that has passed through the lens 92 and is guided to the photoelectric conversion device 100. The photoelectric conversion device 100 in the image capturing device 86 converts the object image formed on the imaging plane of the photoelectric conversion device 100 into an image signal. The image capturing device 86 outputs the image signal read out from the photoelectric conversion device 100. The captured image signal processing circuit 95 is connected to the image capturing device 86 to process the image signal output from the image capturing device 86. The A/D converter 96 is connected to the captured image signal processing circuit 95 to convert the processed image signal (analog signal) output from the captured image signal processing circuit 95 into an image signal (digital signal). The image signal processing unit 97 is connected to the A/D converter 96 to perform arithmetic processing such as various kinds of correction for the image signal (digital signal) output from the A/D converter 96, thereby generating image data. The image data is supplied to the memory unit 87, external I/F unit 89, general control/arithmetic unit 99, recording medium control I/F unit 94, and the like. The memory unit 87 is connected to the image signal processing unit 97 to store the image data output from the image signal processing unit 97. The external I/F unit 89 is connected to the image signal processing unit 97. The image data output from the image signal processing unit 97 is transferred to an external device (for example, personal computer) via the external I/F unit 89. The timing generator 98 is connected to the image capturing device 86, captured image signal processing circuit 95, A/D converter 96, and image signal processing unit 97 to supply timing signals to the image capturing device 86, captured image signal processing circuit 95, A/D converter 96, and image signal processing unit 97. The image capturing device 86, captured image signal processing circuit 95, A/D converter 96, and image signal processing unit 97 operate in synchronism with the timing signals. The general control/arithmetic unit 99 is connected to the timing generator 98, image signal processing unit 97, and recording medium control I/F unit 94 to generally control the timing generator 98, image signal processing unit 97, and recording medium control I/F unit 94. The recording medium 88 is detachably connected to the recording medium control I/F unit 94. The image data output from the image signal processing unit 97 is recorded in the recording medium 88 via the recording medium control I/F unit 94. The above-described arrangement enables a high-quality image (image data) to be obtained if the photoelectric conversion device 100 obtains a high-quality image signal.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2009-174729, filed Jul. 27, 2009, which is hereby incorporated by reference herein in its entirety.

What is claimed is:

1. A photoelectric conversion device comprising:
an isolation portion defining an active region in a semiconductor substrate;
a photoelectric converter arranged in the active region and including a charge accumulation region, the charge accumulation region containing an impurity of a first conductivity type and being capable of accumulating signal charges;
a charge voltage converter arranged in the active region;
a transfer electrode arranged on the active region and configured to form a channel to transfer charges generated by the photoelectric converter to the charge voltage converter;
a first semiconductor region arranged in the active region between the photoelectric converter and the charge voltage converter, the first semiconductor region being covered with the transfer electrode and containing the impurity of the first conductivity type at a concentration lower than that in the charge accumulation region; and
a second semiconductor region extending in the active region along an interface of the isolation portion facing at least the first semiconductor region, the second semiconductor region being of a second conductivity type opposite to the first conductivity type,
wherein the first semiconductor region includes
a first portion, and
a second portion which is adjacent to the first portion on a side of the photoelectric converter and wider in a direction of channel width of the transfer electrode than the first portion, and
the second semiconductor region includes
a third portion extending in a direction of channel length of the transfer electrode between the first portion and the isolation portion, and
a fourth portion extending in the direction of channel width of the transfer electrode between the second portion and the isolation portion.

2. The device according to claim 1, wherein
the third portion has a first side surface which is defined by implanting an impurity of the second conductivity type using the isolation portion as a mask and extends in the direction of channel length so as to face the first portion, and
the fourth portion has a second side surface which is defined by implanting the impurity of the second conductivity type using a resist pattern as a mask and extends in the direction of channel width so as to face the second portion.

3. The device according to claim 1, further comprising a third semiconductor region of the second conductivity type, the third semiconductor region being arranged in the active region between the first semiconductor region and the charge voltage converter so as to prevent charge punch-through from the first semiconductor region to the charge voltage converter.

4. The device according to claim 3, wherein the third semiconductor region is formed by implanting the impurity of the second conductivity type using the transfer electrode as a mask.

5. The device according to claim 1, wherein
the second semiconductor region further includes a fifth portion extending in the active region along an interface of the isolation portion facing the photoelectric converter, and
a width of the fifth portion in a direction to move away from a center of the photoelectric converter is larger than a width of the third portion in the direction of channel width.

6. An image capturing system comprising:
a photoelectric conversion device of claim 1;
an optical system configured to form an image on an imaging plane of the photoelectric conversion device; and
a signal processing unit configured to process a signal output from the photoelectric conversion device to generate image data.

7. A method of manufacturing a photoelectric conversion device having a semiconductor substrate, comprising:
the first step of forming, in the semiconductor substrate, an isolation portion defining an active region including a first region and a second region which is adjacent to the first region in a first direction and is wider in a second direction than the first region;
the second step of forming a second semiconductor region by implanting an impurity of a second conductivity type into the semiconductor substrate using, as a mask, a first resist pattern covering the active region and exposing the isolation portion;
the third step of forming a semiconductor layer by implanting an impurity of a first conductivity type opposite to the second conductivity type using, as a mask, a second resist pattern covering an entire surface of the first region and an outer portion of the second region and exposing an inner portion of the second region, the inner portion being wider in the second direction than the first region, the semiconductor layer including a third region arranged in the first region and a fourth region arranged in the second region, the fourth region being wider in the second direction than the third region;
the fourth step of forming a transfer electrode on the semiconductor layer so as to cover a boundary between the third region and the fourth region;
the fifth step of forming, in the second region, a charge accumulation region of a photoelectric converter, by implanting the impurity of the first conductivity type into the semiconductor substrate using, as a mask, the transfer electrode and a third resist pattern covering the first region and exposing the second region; and
the sixth step of forming a charge voltage converter in the first region by implanting the impurity of the first conductivity type into the semiconductor substrate using, as a mask, the transfer electrode and a fourth resist pattern exposing the first region and covering the second region,
wherein a region of the semiconductor layer in which no impurity is implanted in the fifth step and the sixth step becomes a first semiconductor region,
the first semiconductor region includes
a first portion, and
a second portion which is adjacent to the first portion on a side of the photoelectric converter and wider in a direction of channel width of the transfer electrode than the first portion, and
the second semiconductor region includes
a third portion extending in a direction of channel length of the transfer electrode between the first portion and the isolation portion, and
a fourth portion extending in the direction of channel width of the transfer electrode between the second portion and the isolation portion.

* * * * *